(12) United States Patent
Tomaru et al.

(10) Patent No.: US 6,760,214 B2
(45) Date of Patent: Jul. 6, 2004

(54) ELECTROSTATIC CHUCK FOR ION INJECTOR

(75) Inventors: Kazuhiko Tomaru, Gunma-Ken (JP); Ryuichi Handa, Gunma-Ken (JP); Tsutomu Yoneyama, Gunma-Ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 251 days.

(21) Appl. No.: 09/829,420

(22) Filed: Apr. 10, 2001

(65) Prior Publication Data
US 2001/0050836 A1 Dec. 13, 2001

(30) Foreign Application Priority Data

Apr. 10, 2000 (JP) ........................................ 2000-108415

(51) Int. Cl.⁷ ............................................. H02N 13/00
(52) U.S. Cl. ...................................................... 361/234
(58) Field of Search ........................ 361/234; 523/209; 524/263, 404, 428, 860

(56) References Cited

U.S. PATENT DOCUMENTS

| | | | | | |
|---|---|---|---|---|---|
| 4,039,503 A | * | 8/1977 | Itok | ........................ | 260/37 SB |
| 4,110,300 A | * | 8/1978 | Matsushita | ............... | 260/37 SB |
| 4,588,768 A | * | 5/1986 | Streusand | .................... | 524/443 |
| 5,352,731 A | * | 10/1994 | Nakano et al. | .............. | 524/786 |
| 5,569,684 A | * | 10/1996 | Okami et al. | ................ | 523/209 |
| 5,981,641 A | * | 11/1999 | Takahashi et al. | ........... | 524/428 |
| 6,141,203 A | * | 10/2000 | Sherman | ...................... | 361/234 |

OTHER PUBLICATIONS

Kabayashi et al., Nonionic fluorosilicone surfactants, Journal of Colloidand Interface Science (1993), 152(2), 415–19.*

* cited by examiner

Primary Examiner—Brian Sircus
Assistant Examiner—Z Kitov
(74) Attorney, Agent, or Firm—Millen, White, Zelano & Branigan, P.C.

(57) ABSTRACT

A wafer chuck used in manufacturing processes of integrated semiconductors and liquid crystal panels, more particularly, an electrostatic silicone rubber chuck for ion injectors used in an ion injection process.

20 Claims, 1 Drawing Sheet

ELECTROSTATIC CHUCK FOR ION INJECTOR

FIELD OF THE INVENTION

The present invention relates to a wafer chuck used in manufacturing processes of integrated semiconductors and liquid crystal panels and, more particularly, to an electrostatic silicone rubber chuck for ion injectors used in an ion injection process.

BACKGROUND OF THE INVENTION

In the ion injection process for manufacturing integrated semiconductors or liquid crystal panels, the so-called mechanical chuck utilizing clamps and the so-called electrostatic chuck, such as a wafer chuck utilizing electrostatic adsorption or Johnsen-Rahbeck force, have so far been employed. When the mechanical chuck is in operation, clamps mechanically press down on a wafer and thereby the wafer is warped. In addition, no devices can be formed on the areas where the wafer is covered with the clamps, and so effective wafer space is reduced. With the intention of obviating those defects, therefore, electrostatic chucks have been proposed, and they are operational at present. Examples of an insulating layer with which those electrostatic chucks are provided include layers of plastics such as polyimide, those of ceramics such as alumina and aluminum nitride, and those of gum elastic solids such as silicone rubber.

In the ion injection process, on the other hand, it is required to inhibit wafers from suffering a temperature rise due to the heat evolved by ion beam injection and keep the wafer temperature uniform and constant, thereby ensuring consistent ion injection without thermal damage to the wafers. In order to meet such a requirement, platen apparatus for cooling wafers is in practical use. For instance, such an apparatus is equipped with a cooling mechanism of passing a chiller through channels formed on the back of electrostatic chucks and in the interior of a mount.

In the case of electrostatic chucks constructed from ceramics, their insulating layers to be brought into contact with wafers are so hard that they have inferior conformability to asperity on the back of each wafer. As a result, the thermal resistance between mating surfaces becomes great, and satisfactory heat-dissipating characteristics cannot be achieved. In order to dissolve this problem, the method of passing an inert gas flow, such as a helium flow, through the gap between a wafer and an insulating layer has been proposed, and put to practical use. Therein, the gas flow is used as an intermediate for thermal transfer between the wafer and the insulating layer. However, such a method requires not only micro-machining for forming inert gas flow-passing grooves on the insulating layer surface but also a setup for feeding an inert gas flow, and thereby a rise in production cost is caused.

On the other hand, the electrostatic chucks constructed from polyimides are prevailingly used at present because they can be manufactured with ease and at low prices. However, their thermal conductivity is low and their hardness is high. Therefore, as in the case of electrostatic chucks constructed from ceramics, the polyimide electrostatic chucks have a drawback of being insufficient in heat-dissipating characteristics because their poor conformability to asperity on the back of a wafer causes high thermal resistance between the mating surfaces.

In comparison with the aforementioned chucks, electrostatic chucks constructed from silicone rubbers (as disclosed in Japanese Tokko Hei 2-55175 and Hei 2-63307, wherein the term "Tokko" means an "examined patent publication", and Japanese Tokkai Hei 9-298233, wherein the term "Tokkai" means an "unexamined published patent application") have good conformability to asperity on the back of a wafer because elastic silicone rubber is used for their insulating layers. In the case of chucks utilizing highly heat-conductive silicone rubber in particular, the wafer temperature can be kept uniform with high efficiency. Additionally, general electrostatic chucks constructed from silicone rubber have a structure that a pattern formed of metal foil traces to function as an internal electrode is sandwiched between two sheets of thermally conductive silicone rubber.

In manufacturing a thermally conductive silicone rubber sheet used in such a case, a preform is made first from a thermally conductive silicone rubber composition. Therein, the rubber composition is generally constituted of organopolysiloxane, an inorganic powder having high thermal conductivity, such as boron nitride or aluminum oxide, and a curing agent. More specifically, the preform is made by sheeting the composition on a plastic film by the use of a calender technique, or by dispersing the composition into an organic solvent, shaping the composition into a sheet on a plastic film or glass cloth and then drying it. Then, the preform thus made is subjected to press vulcanization.

In the cases of hitherto known thermally conductive silicone rubber compositions, however, increasing the inorganic powder contents therein with the intention of enhancing their thermal conductivities gives rise to a reduction in the rubber strength. As a result, it becomes difficult to peel silicone rubber sheets apart from a mold or a plastic film. In order to improve the release capability, it has so far been carried out to add an internal release agent, such as zinc stearate, to a thermally conductive silicone rubber composition. Therefore, the use of such a thermally conductive silicone rubber for an electrostatic chuck causes a problem of contaminating silicone wafers with zinc of zinc stearate origin.

In recent years, electrostatic chucks have been upsized to the order of 300–400 mm in diameter to keep pace with the increase in diameter of wafers. In the case of liquid crystal panels, further upsizing is required for electrostatic chucks because those panels have come to use a substrate having a size of 1,000 mm per side. In forming a thermally conductive silicone rubber into such large-sized sheets, it is difficult to release the sheets from molds or the like even when the rubber contains a known internal release agent, such as zinc stearate. Under these circumstances, it has been expected to develop an internal release agent capable of imparting improved release capability to a thermally conductive silicone rubber composition in its molding process, and besides, causing no contamination of wafers by metals.

SUMMARY OF THE INVENTION

Therefore, an object of the invention is to provide an electrostatic silicone rubber chuck for ion injection that has high releasability from a mold and causes no contamination of wafers.

The present object as described above is attained with an electrostatic chuck for ion injectors, comprising a metallic substrate, a first insulating layer, a pattern of conductive trace or traces formed as a single or dual electrode on the first insulating and a second insulating layer provided on the conductive trace or traces: with at least the second insulating layer being produced from cured matter of a thermally conductive silicone rubber composition comprising the following components (A) to (D);

(A) 10 to 69.99 volume % of organopolysiloxanes having an average compositional formula $R^1_a SiO_{(4-a)/2}$, wherein $R^1$ groups are the same or different unsubstituted or substituted monovalent hydrocarbon groups and a is a positive number of from 1.90 to 2.05, (B) 30 to 89.99 volume % of a thermally conductive filler, (C) 0.01 to 10 volume % of a fluorine-modified silicone surfactant, and (D) a curing agent in an amount required for curing the composition containing the components (A), (B) and (C), wherein the total volume % of the components (A), (B) and (C) is adjusted to 100.

Figure 1:
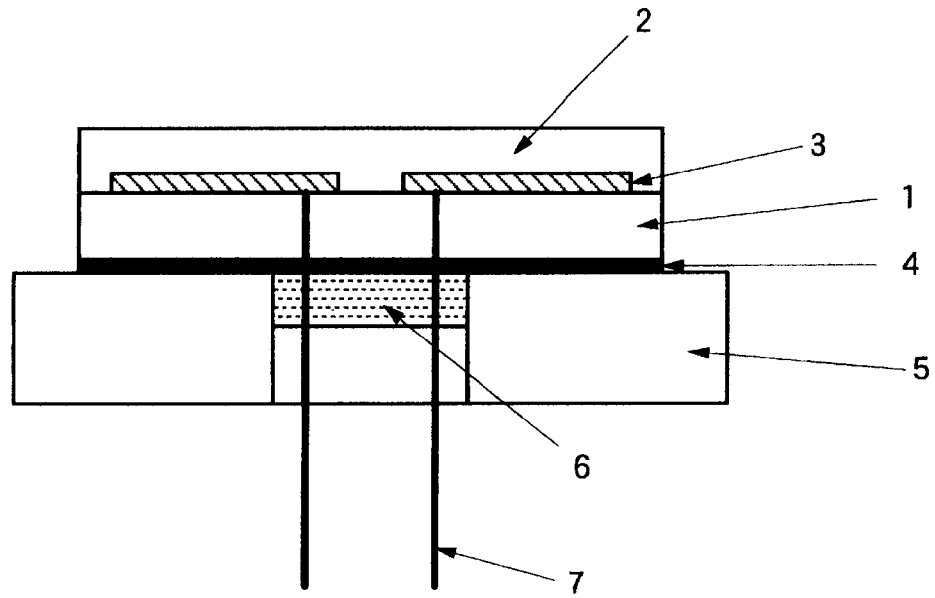
FIG. 1 is a cross-sectional diagram showing an electrostatic chuck according to the invention.

Additionally, the reference numerals used in FIG. 1 designate the following members respectively:

1. First insulating layer
2. Second insulating layer
3. Trace forming a conductive pattern
4. Adhesive
5. Metallic substrate
6. Sealant
7. Lead wire

DETAILED DESCRIPTION OF THE INVENTION

The organopolysiloxanes as Component (A) in the invention, which are represented by an average compositional formula $R^1_a SiO_{(4-a)/2}$, are used as a base polymer of the thermally conductive silicone rubber composition used at least for the second insulating layer of the present electrostatic chuck. Therein, $R^1$ groups are the same or different unsubstituted or substituted monovalent hydrocarbon groups and a is a positive number of from 1.90 to 2.0.

Examples of a monovalent hydrocarbon group as $R^1$ include alkyl groups, such as methyl and ethyl; alkenyl groups, such as vinyl and allyl; aryl groups, such as phenyl or tolyl; cycloalkyl groups, such as cyclohexyl; and groups formed by replacing hydrogen atoms attached to carbon atoms in the groups recited above with halogen atoms or cyano groups, such as chloromethyl, fluoropropyl and cyanoethyl.

Of the organopolysiloxanes described above, not only organopolysiloxanes whose main polymeric chains are dimethyl-polysiloxanes but also organopolysiloxanes having vinyl, phenyl or/and trifluoropropyl groups introduced to their main polymeric chains which are constituted of dimethylsiloxane units are generally preferred as the base polymer of the present composition. Further, it is advantageous that the high molecular chain ends of these organopolysiloxanes be blocked with triorganosilyl groups or hydroxyl groups. Suitable examples of such triorganosilyl groups include trimethylsilyl, dimethylvinylsilyl and trivinylsilyl groups.

It is appropriate that the $R^1$ groups of organopolysiloxanes used as Component (A) comprise at least 50 mole %, particularly at least 80 mole %, of methyl groups and 0.001 to 5 mole %, particularly 0.01 to 0.5 mole %, of vinyl groups.

The organopolysiloxanes used as Component (A) have no particular restrictions as to their polymerization degrees. However, it is appropriate that they have their polymerization degrees in the range of 100 to 20,000, particularly 200 to 10,000. In other words, organopolysiloxanes having various properties, from properties of oil to those of gum, can be employed as Component (A). Therefore, the thermally conductive silicone rubber composition used for the present electrostatic chuck can be adjusted so as to be in a liquid or millable state.

Examples of a thermally conductive filler usable as Component (B) include an alumina powder, an aluminum nitride powder, a boron nitride powder, a quartz powder, a silica powder, zinc oxide, aluminum hydroxide, silicon carbide and magnesium oxide. Of these fillers, metal oxides and metal nitrides are preferred in particular. These fillers are not particularly restricted as to their shapes, but they may have any of powdery, spherical, scaly and acicular shapes. Further, they maybe used alone, or as a mixture of two or more thereof.

The fluorine-modified silicone surfactant used as Component (C) is a component for forming a hydrophobic film on the surface of thermally conductive silicone rubber and thereby keeping the release capability in a very good condition during the press vulcanization process. The Component (C) has no particular restrictions so far as it contains a siloxane linkage, a hydrophilic group and a fluorine-containing group. However, the compounds represented by the following formula can be used to advantage:

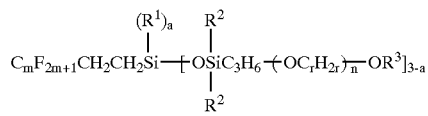

wherein $R^1$ and $R^2$ groups represent the same or different alkyl groups (preferably containing 1 to 3 carbon atoms), $R^3$ represents a hydrogen atom or an alkyl group (preferably containing 1 to 5 carbon atoms), a is an integer of 0 to 2, r is 2 or 3, n is an integer of 1 to 5, and m is an integer of 1 to 8.

Examples of a compound useful as the present fluorine-modified silicone surfactant are illustrated below:

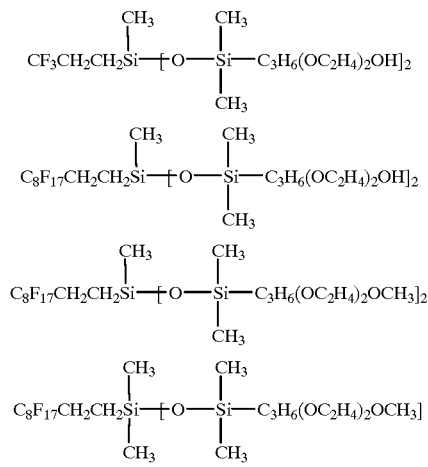

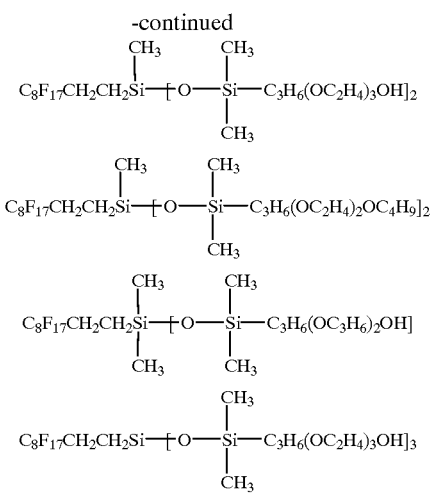

The compounds as illustrated above may be used alone, as a mixture of two or more thereof, or as an oligomer formed by condensation reaction between two or more thereof.

With respect to the proportions of Components (A), (B) and (C) mixed, it is desirable that the proportion of Component (A) be from 10 to 69.99% by volume, that of Component (B) be from 30 to 89.99% by volume and that of Component (C) be from 0.01 to 10% by volume, with the total proportion of Components (A), (B) and (C) being taken as 100% by volume. And more desirable results can be achieved when 15 to 69.9 volume % of Component (A), 40 to 84.9 volume % of Component (B) and 0.01 to 3 volume % of Component (C) are mixed. When the proportion of Component (B) is below 30% by volume, the composition cannot have satisfactory thermal conductivity; while when it is increased beyond 89.99%, it becomes difficult to mix Component (B) with the other components and the resultant composition comes to have poor forming capability because the viscosity and plasticity number thereof is increased. On the other hand, when Component (C) is mixed in a proportion less than 0.01% by volume, it cannot impart sufficient release capability to the composition. However, even when Component (C) is mixed in a proportion higher than 10% by volume, no substantial rise in releasing effect can be expected. So the mixing of Component (C) in such a high proportion is at a disadvantage by merely causing an increase in cost.

It is appropriate that the curing agent as Component (D) be selected depending on the species and the cross-linking reaction mechanism of organopolysiloxanes used as Component (A). When the cross-linking reaction to take place in the present composition is radical reaction, an organic peroxide is usable as Component (D). Such an organic peroxide can be selected properly from known ones, with examples including benzoyl peroxide, 2,4-dichlorobenzoyl peroxide, 4-chlorobenzoyl peroxide, dicumyl peroxide, tert-butyl peroxide and 2,5-dimethyl-2,5-bis(tert-butylperoxy) hexane. These peroxides can be used alone or as a mixture of two or more thereof. They are used in an amount required for curing the present thermally conductive silicone rubber composition. Such an amount is generally within the range of 0.1 to 10 parts by weight when the total amount of Components (A), (B) and (C) is taken as 100 parts by weight.

When the cross-linking reaction is hydrosilylation reaction, or addition reaction between aliphatic unsaturated groups when the organopolysiloxanes used contain them and hydrogen atoms bonded to silicon atoms (SiH groups) contained in organohydrogenpolysiloxanes, combinations of organo-hydrogenpolysiloxanes and addition reaction catalysts, such as platinum group metals and platinum metal compounds, are used as Component (D). In this case, the organopolysiloxanes used as Component (A) are selected from organopolysiloxanes containing aliphatic unsaturated groups (or alkenyl groups), such as vinyl and allyl groups.

Both organohydrogenpolysiloxane and addition reaction catalyst used therein can be selected properly from known ones. Specifically, it is appropriate to select an organohydrogenpolysiloxane having at least two hydrogen atoms bonded to silicon atoms. Suitable examples of an addition reaction catalyst include chloroplatinic acid, alcohol-modified chloroplatinic acid (U.S. Pat. No. 3,220,972) and chloroplatinic acid-olefin complexes (U.S. Pat. Nos. 3,159,601, 3,159,662 and 3,775,452). It is effective to add an organohydrogenpolysiloxane in a proportion of 0.5 to 5 mole % to the alkenyl groups present in organopolysiloxanes used as Component (A). As to the addition reaction catalyst, on the other hand, the use in the so-called catalytic amount can serve the purpose. Specifically, the suitable proportion of a catalyst used to the total composition is from 1 to 1,000 ppm on a platinum metal basis.

The present electrostatic chuck is an electrostatic chuck for ion injector use which comprises a metallic substrate, a first insulating layer provided on the substrate, a pattern of conductive trace or traces formed as an electrode on the first insulating layer and a second insulating layer provided on the conductive pattern, and characterized in that the second insulating layer to be brought into direct contact with a wafer is produced from cured matter of a thermally conductive silicone rubber composition comprising the aforementioned Components (A) to (D) (thermally conductive silicone rubber). By being constituted as mentioned above, the present electrostatic chuck can have excellent forming suitability (releasability), and besides, wafer pollution by the chuck can be greatly reduced.

The first insulating layer has no particular restrictions as to materials from which it is formed. For instance, it may be formed from any of ceramics, resins such as polyimide, and elastic solids such as silicone rubber. In the invention, however, it is appropriate that silicone rubber, especially thermally conductive silicone rubber, be used for forming the first insulating layer. Of these materials, cured matter of a thermally conductive silicone rubber composition comprising Components (A) to (D) is the most suitable material.

Additionally, it is advantageous that the first insulating layer has a thermal conductivity of 1 W/mK or above, particularly 2 W/mK or above.

The suitable thickness of the first insulating layer is from 50 to 1,000 μm.

Figure 2:
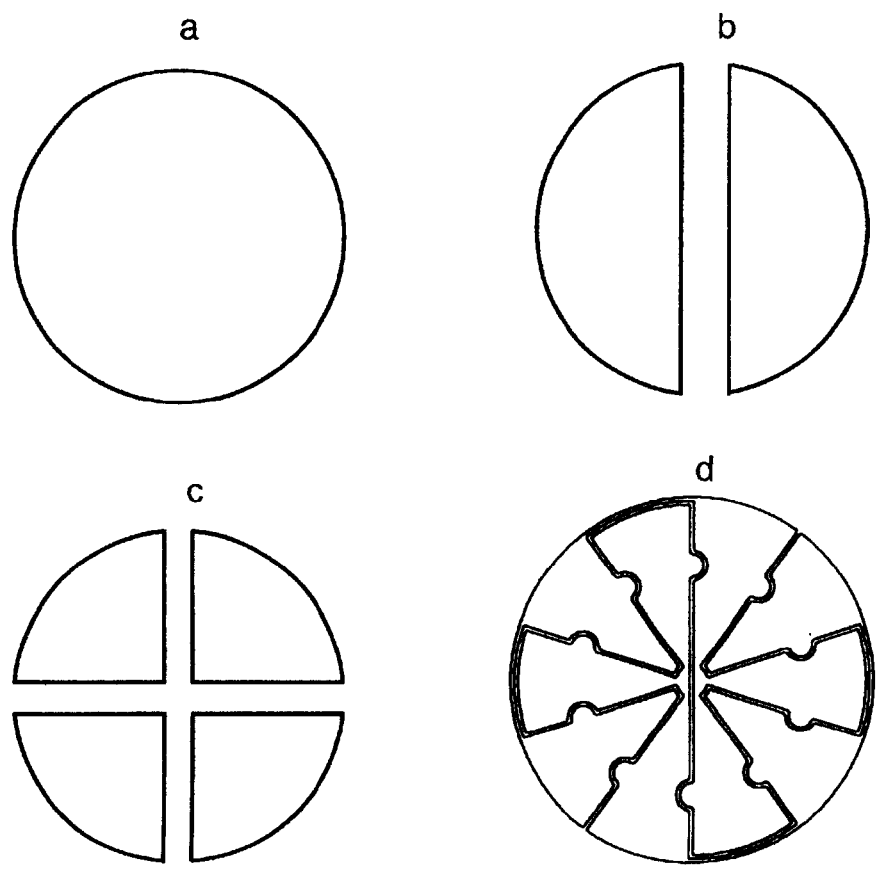
FIG. 2 depicts typical conductive patterns. The pattern (a) functions as an electrode of single polarity, and each of the patterns (b), (c) and (d) functions as an electrode of dual polarity.

The following is detailed description of the present electrostatic chuck, which is made in accordance with the figures. FIG. 1 is a cross-sectional diagram of an electrostatic chuck, and FIG. 2 shows conductive patterns. Additionally, the chuck has primer layers at the interface between the conductive pattern 3 and the first insulating layer 1 and that between the conductive pattern 3 and the second insulating layer 2, but these layers are not drawn in FIG. 1.

The metallic substrate 5 is used as a mount for the electrostatic chuck, and the material suitable therefor is aluminum, anodized aluminum or duralmin.

The pattern 3 of conductive trace(s) functions as an electrode for adsorption of the electrostatic chuck to a wafer. Examples of a material usable for conductive trace(s)

include metallic conductors, such as copper, aluminum, nickel, silver and tungsten. The suitable thickness of a conductive trace is from 1 to 100 μm, preferably from 5 to 50 μm. When the pattern of conductive trace(s) has a thickness of below 1 μm, it is poor in mechanical strength, so it tends to be broken in the lamination process of the second insulating layer 2 or by pressure applied thereto by a soldering iron when lead wires for voltage supply are soldered thereto. However, even when the thickness thereof is increased beyond 100 μm, the pattern of conductive trace(s) can have no significant improvements in mechanical strength and electric properties. Therefore, the use of such a thick trace is on the whole unfavorable in point of material cost.

The laminate (referred to as the rubber chuck hereinafter) in which the pattern of conductive trace(s) 3 is sandwiched between the first insulating layer 1 and the second insulating layer 2 is not particularly restricted in its manufacturing process. However, it is appropriate that the following process be adopted:

To begin with, a first insulating layer is formed. Then, a metallic foil treated with a primer (e.g., a silane coupling agent or titanium coupling agent) is laminated on the first insulating layer by hot press forming. And the metal foil is shaped into a desired pattern by etching treatment. In the next place, a preform is made by sheeting on a plastic film a thermally conductive silicone rubber composition according to the invention, which forms a second insulating layer after curing, by the use of a calender technique, or by dispersing a thermally conductive silicone rubber composition as described above in an organic solvent, forming the composition into a sheet on a plastic film or glass cloth, followed by drying. The thus made preform is laminated on the primer-treated face of the patterned metal foil described above by hot press forming, and then the plastic film or glass cloth is peeled apart therefrom.

When the first insulating layer is an elastic layer, it can be formed in the same manner as the foregoing second insulating layer. In this case, a preform which becomes the first insulating layer after curing is treated with a primer, and thereon a metallic foil is laminated by hot press forming, and thereafter the plastic film is peeled apart.

When the thermally conductive silicone rubber of which the second insulating layer 2 is formed has a thermal conductivity of at least 1 W/mK, it can serve for the intended purpose. As demands for electrostatic chucks having higher thermal conductivity have grown with a recent increase in the amount of heat intruded, it is advantageous that the second insulating layer has thermal conductivity of at least 2 W/mk. The suitable hardness of thermally conductive silicone rubber used for the second insulating layer 2 is below 85, preferably from 50 to 80, determined according to the method defined in JIS 6249. When the second insulating layer has a hardness higher than 85, it tends to fail in following the asperity of wafer's back, so it tends to have poor adhesion to the wafer's back, thereby lowering the efficiency of heat dissipation.

From the viewpoint of heat dissipation, it is advantageous to render the second insulating layer as thin as possible. Specifically, it is appropriate that the thickness thereof be from 50 to 1,000 μm. When the second insulating layer is thinner than 50 μm, the resultant electrostatic chuck suffers electrical breakdown with a high probability because the dielectric withstand voltage is lowered; while when the thickness of the second insulating layer is increased beyond 1,000 μm, reduction in wafer cooling efficiency tends to occur because the heat dissipation capability is lowered.

The evenness and the surface roughness on the adsorption side of the second insulating layer 2 affect the adhesion to a wafer, and so they have effect on the contact thermal resistance between the wafer and the second insulating layer surface. From the viewpoint of ensuring good adhesion to the back of a wafer, it is appropriate that the evenness be controlled to below 50 μm. When the evenness is increased beyond 50 μm, the adhesion to the wafer's back is lowered, and so it tends to occur that the heat dissipating properties are deteriorated and the efficiency of wafer cooling is reduced. In addition, the surface roughness (Ra) of below 5 μm is favorable for enhancement of adhesion to the back of a wafer. When the surface roughness is increased beyond 5 μm, it tends to occur that the conformity with the asperity of the wafer's back cannot be achieved, thereby resulting in poor adhesion to the wafer's back and reduced heat dissipation.

When the first insulating layer 1 and the metallic substrate 5 are laminated in the course of forming the present electrostatic chuck, an adhesive 4 may be used. As examples of an adhesive usable herein, mention may be made of known silicone rubber adhesives. For avoiding reduction in the thermal conductivity, it is appropriate that the adhesive be applied in the smallest possible amount. The suitable thickness of the adhesive layer is from 0.1 to 30 μm.

Patterns that conductive traces 3 can be shaped into are broadly classified as single-polarity varieties (generally functioning as positive electrode) and dual-polarity varieties (enabling even application to positive and negative electrodes). In the invention, any of these varieties may be employed.

Lead wires 7 connect the pattern of conductive trace(s) to electrode(s). The voltage applied to the present electrostatic chuck is generally from 0 to ±4,000 V. Therefore, it is advantageous to use wires coated with fluoropolymers having high dielectric withstand voltages, such as PTFE, FEP and PFA.

The sealant 6 is laid down for the purpose of securing insulation between lead wire-trace connection spots and insulation between these connection spots and the metallic substrate. Examples of a sealant usable herein include known sealants of silicone, epoxy and polyimide types.

The present invention will now be illustrated in more detail by reference to the following example. However, the invention should not be construed as being limited to this example.

The entire disclosure of all applications, patents and publications, cited above and below, and of corresponding Japanese application No. 2000-108415, filed Apr. 10, 2000, is hereby incorporated by reference.

EXAMPLE

Electrostatic chucks were made in a process described below so that their structure had a cross-sectional view as shown in FIG. 1. Therein, the first insulating layer was formed of silicone rubber having a diameter of 300 mm, a thickness of 650 μm and a thermal conductivity of 3.5 W/mK. And the second insulating layer was formed of silicone rubber having a diameter of 300 mm, a thickness of 300 μm, a thermal conductivity of 1.5 W/mK, a hardness of 60°, a surface roughness (Ra) of 2 μm, and an evenness of 30 μm on the adsorption side. Further, copper foil having a thickness of 35 μm was used for conductive pattern formation, and shaped into a conductive pattern shown in FIG. 2-d so as to have a diameter of 296 mm. In addition, an aluminum sheet having a diameter of 400 mm and a thickness of 15 mm was used as a metallic substrate, and an adhesive layer having a thickness of 15 μm was provided between the aluminum substrate and the first insulating layer.

The thermally conductive silicone rubber composition used for the first insulating layer (referred to as Composition 1) was constituted of the following ingredients A) to D).

Composition 1

A) 100 parts by weight (55.0% by volume) of methylvinylpolysiloxanes having an average polymerization degree of 8,000 and consisting of 99.85 mole % of dimethylsiloxane units and 0.15 mole % of methylvinylsiloxane units, B) 190 parts by weight (44.5% by volume) of boron nitride powder, UHP-1 (trade name, a product of Showa Denko Co., Ltd.), C) 1 parts by weight (0.5% by volume) of fluorine-modified silicone surfactant having the following structural formula:

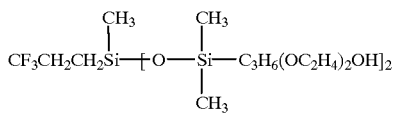

and

D) 2 parts by weight of di-t-butylperoxide.

Process 1:

The foregoing Composition 1 was dissolved in toluene so as to prepare a solution having a solid concentration of 30 weight %. Glass cloth (having a width of 500 mm, a length of 100 mm and a thickness of 50 μm) was coated with that solution by means of an impregnation coater, and the solvent was evaporated with a hot-air drying oven (100° C.). Thus, a preform 2 (the thickness of which was controlled to 850 μm, from a consideration of compression forming to undergo). Then, the preform 2 was cut into a 400 by 400 millimeters square, and placed on a PET film (thickness: 100 μm). Further, a primer-treated copper foil (thickness: 35 μm) was put on the preform, and thereon a PET film (thickness: 100 μm) was furthermore placed. The thus stacked matter underwent compression forming for 10 minutes at 180° C. under a pressure of 8 MPa, and then the PET films were released therefrom. Thus, a laminate of thermally conductive silicone rubber and copper foil was obtained. The copper foil of the laminate was etched so as to have the pattern shown in FIG. 2-d, thereby forming a copper electrode.

On the other hand, the thermally conductive silicone rubber Composition 2 described below was used for the second insulating layer.

Composition 2:

A) 100 parts by weight (53.0% by volume) of methylvinylpolysiloxanes having an average polymerization degree of 8,000 and consisting of 99.85 mole % of dimethylsiloxane units and 0.15 mole % of methylvinylsiloxane units, B) 350 parts by weight (46.8% by volume) of globular aluminum powder, Adomafine A041R (trade name, a product of Adomatex Co., Ltd.), C) 0.3 parts by weight (0.25% by volume) of fluorine-modified silicone surfactant having the following structural formula:

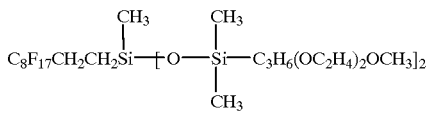

and

D) 2 parts by weight of di-t-butylperoxide.

Process 2:

The ingredients A) to D) mentioned above were mixed together, and spread over a shot blast-treated PET film (having a width of 500 mm, a length of 100 mm and a thickness of 100 μm) in accordance with calender processing, thereby making a sheet of preform 1 (thickness: 300 μm). The electrode pattern side of the laminated sheet formed in the foregoing Process 1 was treated with a primer, and thereon the preform 1 was superimposed. This superimposed matter was subjected to 10-minute press forming under a condition of 180° C.-5 MPa. Then, the PET film was separated from the second insulating layer. The thus laminated matter was stamped into a disk shape having a diameter of 300 mm by means of a stamping die, thereby forming a rubber chuck having a patterned copper electrode between the first insulating layer and the second insulating layer.

The rubber chuck formed in the aforementioned Process 2 was bonded to an aluminum substrate (diameter: 400 mm, thickness: 15 mm) using a silicone rubber adhesive (KE1825, trade name, produced by SHIN-ETSU CHEMICAL CO., LTD.) while applying thereto a pressure of 3 MPa for 10 minutes at 120° C. PET-covered electric wires were soldered to the copper electrode, and a silicone sealant KJR632 was laid. Thus, an electrostatic chuck was produced.

The thus produced electrostatic chuck was fitted to an ion injector, and ion injection into a wafer having a diameter of 300 mm was carried out under conditions that the adsorption voltage was ±1,200 V, the amount of heat injected was 0.5 W/cm$^2$, the dosage was 5×10$^{15}$ ions/cm$^2$ and the injection time was 500 sec. Therein, satisfactory ion injection was effected as the wafer temperature was kept at 60° C. In addition, the amounts of metallic impurities attached to the wafer were determined by whole reflection X-ray fluorescence analysis. As a result, the metallic contamination of the wafer at every measurement point was found to be satisfactorily slight. Specifically, the metallic impurities (including Fe, Cr, Na, K, Cu and Al) at every measurement point was below 5×10$^{10}$ atoms/cm$^2$. Further, particles stuck to the wafer's back was measured with a particle counter; as a result, it was found that the number of particles measuring 0.16 to 2.0 μm in size was 2,250. This number is significantly smaller than ever. As demonstrated from these experimental results, the present electrostatic chuck was very useful in an ion injection process.

Comparative Example

In forming a rubber chuck in the same process as in Example, a thermally conductive silicone rubber composition different from Composition 2 of Example in the component C) was employed. Specifically, 0.3 parts by weight of the fluorine-modified silicone surfactant in Composition 2 of Example was replaced with 2 parts by weight of zinc stearate. As a result, it was found that the PET film was difficult to separate from the second insulating layer, thereby failing to produce an electrostatic chuck.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius; and, unless otherwise indicated, all parts and percentages are by weight.

The entire disclosure of all applications, patents and publications, cited above, and of corresponding Japan application No. 2000-108415, filed Apr. 10, 2000, is hereby incorporated by reference.

What is claimed is:

1. An electrostatic chuck for ion injectors, comprising a metallic base, a first insulating layer, a pattern of conductive trace or traces formed as an electrode of single or dual polarity on the first layer, and a second insulating layer provided on the conductive trace or traces, wherein at least said second insulating layer has been produced from cured matter of a thermally conductive silicone rubber composition comprising the following components (A) 10 to 69.99 volume % of organopolysiloxanes having an average compositional formula $R^1_a SiO_{(4-a)/2}$, wherein $R^1$ groups are, each independently, an unsubstituted or substituted monovalent hydrocarbon group, and a is a positive number of 1.90 to 2.05, (B) 30 to 89.99 volume % of a thermally conductive filler, (C) 0.01 to 10 volume % of a fluorine-modified silicone surfactant, and (D) a curing agent in an amount required for curing the composition containing the components (A), (B) and (C), wherein the total volume % of the components (A), (B) and (C) is adjusted to 100.

2. An electrostatic chuck for ion injectors as described in claim 1, wherein both first and second insulating layers are cured matters of thermally conductive silicone rubber compositions.

3. An electrostatic chuck for ion injectors as described in claim 1, wherein the fluorine-modified silicone surfactant as Component (C) is a compound of formula

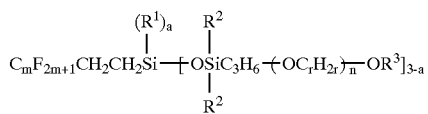

wherein $R^1$ and $R^2$ are, each independently, an alkyl group, $R^3$ is a hydrogen atom or an alkyl group, a is an integer of 0 to 2, r is 2 or 3, n is an integer of 1 to 5, and m is an integer of 1 to 8.

4. An electrostatic chuck for ion injectors as described in claim 1, wherein the thermally conductive filler as Component (B) is a metal oxide or a metal nitride.

5. An electrostatic chuck for ion injectors as described in claim 1, wherein the organopolysiloxanes as Component (A) have their polymerization degrees in the range of 100 to 20,000.

6. An electrostatic chuck for ion injectors as described in claim 2, wherein both first and second insulating layers are cured matters of thermally conductive silicone rubber compositions, each comprising components (A) to (D).

7. An electrostatic chuck for ion injectors as described in claim 2, wherein a thermal conductivity of the second insulating layer is at least 1.0 W/mK.

8. An electrostatic chuck for ion injectors as described in claim 2, wherein the hardness of the thermally conductive silicone rubber used for the second insulating layer is 50 to 80, determined according to the method defined in JIS 6249.

9. An electrostatic chuck for ion injectors as described in claim 1, wherein $R^1$ groups of the organopolysiloxanes as Component (A) are, each independently, an alkyl, alkenyl, aryl, or a cycloalkyl group, each independently, optionally substituted with one or more halogen or cyano groups.

10. An electrostatic chuck for ion injectors as described in claim 9, wherein some of the $R^1$ groups of the organopolysiloxanes as Component (A) are, each independently, vinyl, phenyl or trifluoropropyl group.

11. An electrostatic chuck for ion injectors as described in claim 9, wherein at least 50 mole % of the $R^1$ groups of the organopolysiloxanes as Component (A) are methyl groups, and 0.001 to 5 mole % of said $R^1$ groups is vinyl.

12. An electrostatic chuck for ion injectors as described in claim 1, wherein conductive filler as Component (B) is alumina powder, an aluminum nitride powder, a boron nitride powder, a quartz powder, a silica powder, zinc oxide, aluminum hydroxide, silicon carbide or magnesium oxide, or a mixture thereof.

13. An electrostatic chuck for ion injectors as described in claim 1, wherein the cured matter of a thermally conductive silicone rubber composition contains 15 to 69.9 volume % of Component (A), 40 to 84.9 volume % of Component (B) and 0.01 to 3 volume % of Component (C).

14. An electrostatic chuck for ion injectors as described in claim 1, wherein Component (D) is an organic peroxide or is a combination of one or more organohydrogenpolysiloxanes and one or more addition reaction catalysts.

15. An electrostatic chuck for ion injectors as described in claim 2, wherein a thermal conductivity of the second insulating layer is at least 2.0 W/mK.

16. An electrostatic chuck for ion injectors as described in claim 1, wherein a thickness of the second insulating layer is 50 to 1,000 μm.

17. An electrostatic chuck for ion injectors as described in claim 1, wherein an adhesive is used between the first insulating layer and the pattern of conductive trace or traces formed as an electrode.

18. An electrostatic chuck for ion injectors as described in claim 1, wherein the electrode is a single polarity electrode.

19. An electrostatic chuck for ion injectors as described in claim 1, wherein the electrode is a dual polarity electrode.

20. An ion injector comprising an electrostatic chuck according to claim 1.

* * * * *